United States Patent
Verschuuren et al.

(10) Patent No.: US 9,105,867 B2
(45) Date of Patent: Aug. 11, 2015

(54) METHOD FOR FORMING A PATTERNED LAYER ON A SUBSTRATE

(75) Inventors: Marcus Antonius Verschuuren, Eindhoven (NL); Herbert Lifka, Eindhoven (NL); Cristina Tanase, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 834 days.

(21) Appl. No.: 12/666,838

(22) PCT Filed: Jun. 30, 2008

(86) PCT No.: PCT/IB2008/052612
§ 371 (c)(1),
(2), (4) Date: Dec. 28, 2009

(87) PCT Pub. No.: WO2009/004560
PCT Pub. Date: Jan. 8, 2009

(65) Prior Publication Data
US 2010/0203235 A1     Aug. 12, 2010

(30) Foreign Application Priority Data

Jul. 4, 2007   (EP) .................................... 07111734
Sep. 18, 2007  (EP) .................................... 07116650

(51) Int. Cl.
*B05D 5/12*   (2006.01)
*H01L 51/52*  (2006.01)
(Continued)

(52) U.S. Cl.
CPC ........ *H01L 51/5212* (2013.01); *H01L 51/5206* (2013.01); *H01L 51/56* (2013.01); *H01L 27/301* (2013.01); *H01L 51/0021* (2013.01); *H01L 2251/105* (2013.01)

(58) Field of Classification Search
USPC ............................................. 427/66
See application file for complete search history.

(56) References Cited

U.S. PATENT DOCUMENTS 6,124,039 A * 9/2000 Goetz et al. .................... 428/457
6,957,608 B1  10/2005 Hubert et al.
(Continued)

FOREIGN PATENT DOCUMENTS

CN   1844300 A    10/2006
EP   1791196 A2   11/2006
(Continued)

OTHER PUBLICATIONS

Martinez et al. "Properties of Transparent Zinc-Tin Oxide Conducting Films Prepared by Chemical Spray Pyrolysis" Jul. 2004.*

*Primary Examiner* — Austin Murata
(74) *Attorney, Agent, or Firm* — Yuliya Mathis

(57) ABSTRACT

This invention relates to a method for forming a patterned layer on a substrate by means of an imprint process. According to the method a first layer is provided on the substrate, and a pattern of recesses is provided in the first layer by imprinting the layer with a patterning means. Then the first layer is cured. The curing is followed by performing a first surface treatment onto the first layer to make the surface of thereof hydrophilic, and then performing a second surface treatment onto a selected subarea of the surface of the first layer to make the. subarea hydrophobic. The subarea includes surface portions between the recesses and excludes the recesses. Finally, a conducting pattern material (41) is deposited into the recesses.

20 Claims, 3 Drawing Sheets

(51) Int. Cl.
*H01L 51/56* (2006.01)
*H01L 27/30* (2006.01)
*H01L 51/00* (2006.01)

(56) References Cited

U.S. PATENT DOCUMENTS

| | | | |
|---|---|---|---|
| 2002/0167619 A1* | 11/2002 | Bietsch et al. | 349/1 |
| 2003/0010866 A1 | 1/2003 | Wilksch | |
| 2003/0108664 A1* | 6/2003 | Kodas et al. | 427/125 |
| 2005/0022374 A1 | 2/2005 | Hirai et al. | |
| 2006/0016027 A1 | 1/2006 | Schmiedl et al. | |
| 2006/0050385 A1* | 3/2006 | Uehara et al. | 359/465 |
| 2006/0160276 A1* | 7/2006 | Brown et al. | 438/149 |
| 2006/0232161 A1* | 10/2006 | Odaka et al. | 310/309 |
| 2007/0011904 A1 | 1/2007 | Sherwood et al. | |
| 2007/0065962 A1* | 3/2007 | Pichler | 438/47 |
| 2007/0096112 A1* | 5/2007 | Hoshi | 257/79 |
| 2007/0119048 A1* | 5/2007 | Li et al. | 29/623.5 |
| 2007/0186968 A1* | 8/2007 | Nakauchi et al. | 136/244 |
| 2007/0254162 A1* | 11/2007 | Kozaki et al. | 428/426 |
| 2007/0287270 A1* | 12/2007 | Li et al. | 438/478 |
| 2008/0088227 A1* | 4/2008 | Lee | 313/504 |
| 2010/0163851 A1* | 7/2010 | Buchel et al. | 257/40 |
| 2010/0203235 A1 | 8/2010 | Verschuuren et al. | |

FOREIGN PATENT DOCUMENTS

| | | |
|---|---|---|
| GB | 2427509 A | 6/2005 |
| GB | 2430547 A | 9/2005 |
| JP | 9115672 A | 5/1997 |
| JP | 2000105548 A | 4/2000 |
| JP | 2002124381 A | 4/2002 |
| JP | 2005243379 A | 9/2005 |
| JP | 2005310534 A | 11/2005 |
| JP | 2006005109 A | 1/2006 |
| JP | 2006297694 A | 11/2006 |
| JP | 2007080579 A | 3/2007 |
| WO | 9819201 A1 | 5/1998 |
| WO | 2004095535 A2 | 11/2004 |
| WO | 2004095535 A3 | 11/2004 |
| WO | 2005045524 A2 | 5/2005 |
| WO | 2005045524 A3 | 5/2005 |
| WO | WO/2007/004115 * | 1/2007 |
| WO | 2007028733 A1 | 3/2007 |

* cited by examiner

METHOD FOR FORMING A PATTERNED LAYER ON A SUBSTRATE

FIELD OF THE INVENTION

The present invention relates to a method for forming a patterned layer on a substrate and more particularly to a method for providing extra metallization to an organic light emitting device, OLED.

BACKGROUND OF THE INVENTION

Manufacturing methods based on organic semiconductor materials resulting in attractive applications like Organic Light Emitting Devices (OLEDs), also known as Organic Electroluminescent Devices (OELs), and photovoltaic devices (i.e. organic solar cells) are of great interest today. The main advantages of using organic materials are low cost and a capacity for large-area deposition, even on flexible substrates. Furthermore, the large variability of organic compounds allows tailoring the materials for specific applications.

The OLED is a light-emitting device that typically consists of a number of organic layers which are based on small molecules and/or polymers and sandwiched between two electrodes, the anode and the cathode. Each layer is optimized for its own functionality. The light emitting area of the organic light emitting device preferably consists of a hole transport layer, an emitting layer, and an electron transport layer. The light-emitting is based on electrodes with electrons and holes injected from the cathode and the anode that are used to selectively excite levels in the organic molecules of the organic layers.

Unlike Liquid Crystal Displays (LCD) and field emission displays (FED), which are constructed of separate layers of materials that have been assembled, OLEDs are monolithic devices, because the layers are deposited on each other, creating a single unit.

The photovoltaic device has the fundamental structure of an OLED. The main difference is that in these devices a photovoltaic mode of the organic layers is utilized such that shining a light on the device results in a current and/or voltage which is generated at the electrodes (in the OLED a light emitting mode is utilized such that application of a voltage across the electrodes causes light to be emitted). In the following mainly OLEDs are described, but the same principles yield for organic solar cells.

For large area OLED lighting, a large current is required to drive the device. For bottom emissive small area OLEDs the cathode usually has a low enough resistance, however for large area lighting applications the resistance has to be at least 10 times lower. Using common thin film anode and cathode materials, e.g. ITO and Al respectively, results in a large sheet resistance and the large currents give rise to substantial voltage drop. Examples of voltage drops caused by the anode and cathode for different electrode sheet resistance are shown in Table 1.

TABLE 1

| Substrate | Voltage drop [V] Illumination | | Voltage drop [V] Lumination | |
|---|---|---|---|---|
| Ω per square | 20 lm/W | 100 lm/W | 20 lm/W | 100 lm/W |
| 15 | 225 | 45 | 225 | 45 |
| 10 | 160 | 32 | 160 | 32 |
| 1 | 16 | 3.2 | 16 | 3.2 |
| 0.1 | 1.6 | 0.3 | 1.6 | 0.3 |
| 0.01 | 0.16 | 0.03 | 0.16 | 0.03 |

The voltage drop gives rise to inhomogeneous luminance of the large area. The sheet resistance of the anode and cathode metals sets a limit to the maximum size of a uniformly lit area, a light tile, which has an area in the order of a few square centimeter in the current material systems. For large area applications the sheet resistance of the metal should be well below 0.01Ω per square.

Techniques to further increase the area of the light tile are known. In these techniques additional metallization is added onto the substrate to decrease the sheet resistance. Referring to FIG. 1b, which illustrates a prior art light tile, a large area tile 40 is subdivided into subtiles, or pixels, 44 for which extra fine metallization must be used, which metallization pattern is hereinafter referred to as a mash 42. The subtiles 44 are interconnected by good conducting metal tracks, which tracks are herein after referred to as a grid 41. The additional metallization acts as a shunt and provides an overall lower sheet resistance. For display purposes the anode requires extra metallization for shunting according to the description above.

For the implementation of the extra metallization for shunting in an OLED two different technologies are currently used to perform the two types of patterned metallization: 1) For the mash manufacture thin film technology is used. This becomes rather expensive due to the use of photolithography and long deposition times in expensive machines. 2) For the grid manufacture thick film technology is used, which adds extra fabrication steps in the manufacturing of the display. Thus, the manufacture of the patterned metallizations is associated with drawbacks of being complicated and expensive.

SUMMARY OF THE INVENTION

It is an object of the present invention to provide an improved method for providing patterned metallization to display devices, which alleviates the above-mentioned drawbacks of the prior art.

This object is achieved by a method that utilizes an imprinting process according to the present invention.

Thus, in accordance with an aspect of the present invention, there is provided a method for forming a patterned layer on a substrate by means of an imprinting process. Practically this comprises the steps of:

providing a first patterning means for defining a pattern,
providing a first layer on a surface of the substrate,
providing a pattern of recesses in the first layer by imprinting the first layer with the patterning means,
curing the first layer,
performing a first surface treatment onto the first layer to make the surface of the first layer hydrophilic,
performing a second surface treatment onto a selected subarea of the surface of the first layer to make the subarea hydrophobic, said subarea including surface portions between said recesses and excluding the recesses, and;
depositing a conducting pattern material into the recesses.

Hence, there is provided a method for forming a patterned layer on a substrate which utilizes imprinting a patterning means into a first layer to create a pattern of recesses. By utilizing the imprinting technique a low cost process for the manufacturing of patterned substrates is achieved, which process is fast and do not need expensive lithographic equipment, lithographic masks, vacuum deposition equipment and time consuming processing steps known from prior art. Once the patterning means for defining a pattern is provided, this may be used repeatedly in a manufacturing line. It should be noted that the patterned layer substrate resulting from this method is useful for manufacturing other devices than OLED devices and photovoltaic devices such as organic solar cells, although mainly OLED devices have been discussed above in the background of the invention.

In accordance with a second embodiment of the method, the method further comprises the step of providing a barrier layer after curing the first layer. By providing a barrier layer water and air is prevented from diffusing into the device. This prolongs the lifetime for an OLED or an organic solar cell which is manufactured using the present method. Furthermore the barrier layer is advantageous when producing flexible OLEDs.

In accordance with a third embodiment of the method, the step of depositing a pattern material into the recesses further comprises the steps of:

depositing a second layer onto the first layer, wherein the second layer contains polar molecules;

allowing the second layer to dry, wherein the second layer is redistributed from the hydrophobic subarea into the recesses.

The steps may be repeated if desired. The first layer is subjected to surface treatments so as to make the first layer hydrophilic after which selected surface areas are then made hydrophobic, resulting in patterned hydrophobic and hydrophilic subareas of the surface of the first layer. This is advantageous since by having hydrophilic subareas and hydrophobic subareas, a second material, in particular if it contains polar molecules, will be more likely to wet subareas that are hydrophilic than subareas that are hydrophobic, hence by choosing the material of the second layer in a proper way this will favour the distribution of the second material into the hydrophilic areas, i.e. the recesses of the first layer.

In accordance with a fourth embodiment of the method, the method further comprises the steps of:

masking the first and second layers providing unmasked areas, depositing a third layer onto the unmasked areas.

Thereby, the method provides an advantageous way of creating a combined pattern. A first pattern is formed as the recesses are filled with the material of the second layer, and this first pattern is then combined with the third layer, which is preferably chosen to be a thinner coating which is provided onto selected, unmasked, areas of the patterned first layer.

In accordance with a fifth embodiment of the method, the step of masking is done with a shadow mask.

In accordance with a sixth embodiment of the method, the third layer is conducting. Thus, the method is advantageously used for creating a combined pattern of conducting material, resulting in a smooth flat transparent surface with integrated current spreading grid pattern and a thinner conducting mash which combined pattern is advantageous for providing current spreading, i.e. shunting, in for instance a display of OLED type or an organic solar cell.

In accordance with a seventh embodiment of the method, the step of depositing a third layer is done by means of spray pyrolysis of tin/zinc solutions which is advantageous compared to sputter deposition of for example Indium Tin Oxide (ITO).

In accordance with an eighth embodiment of the method, the step of depositing a third layer is done by sputtering.

In accordance with a ninth embodiment of the method, the first layer is a sol-gel material. Sol-gel materials, or sol-gel systems, have advantageous properties (high temperature resistance, transparency, hardness etc.). Furthermore sol-gel materials can be patterned by soft-lithographic techniques, which allows conformal contact over large areas.

In accordance with a tenth embodiment of the method, the method further comprises the steps of:

at least partly reacting the sol-gel material before the step of imprinting.

Depending of the sol-gel material it is advantageous to adapt the amount of reacting of the sol-gel layer to provide a suitable viscosity of the first layer to be able to produce a pattern by imprinting the patterning means into the surface of the sol-gel layer.

In accordance with an eleventh embodiment of the method, the first layer is a polymer which is advantageous. Furthermore, a first layer consisting of polymer allows for removal of the substrate which can be advantageous when manufacturing flexible substrates.

In accordance with a twelfth embodiment of the method, the first surface treatment is one of a UV-ozone treatment, a plasma treatment and wet chemical oxidation methods which processes are convenient to use to patterned surfaces.

In accordance with a thirteenth embodiment of the method, the second surface treatment is done by means of applying a reactive hydrophobic precursor.

In accordance with a fourteenth embodiment of the method, the step of depositing a second material is done by means of one of spin coating, spray coating, ink jetting, or a doctors blade distribution which offers convenient ways of distributing the second material evenly onto the first layer.

In accordance with a fifteenth embodiment of the method, the second layer is a metal containing liquid, which is advantageous as the metal containing liquid is easy to apply to the first layer, and is suitable for the purpose of creating conductive patterns in the sol-gel layer.

In accordance with a sixteenth embodiment of the method, the metal containing liquid contains one of a metal precursor or metal nano particles.

In accordance with a seventeenth embodiment of the method, after drying the metal containing liquid the following steps are performed:

applying a treatment, wherein the precursors are converted to nucleation sites for deposition of electro-less metal, depositing a thin electro-less metal layer on the nucleation sites.

By converting the precursors to nucleation sites, a metal layer may be grown hence providing a second way of metallizing the pattern of recesses.

In accordance with an eighteenth embodiment of the method, the thin electro-less metal layer is arranged to serve as a mirror. Hence, a fine mirror pattern is achieved in the sol-gel layer in an advantageous way.

In accordance with a nineteenth embodiment of the method, the thin electro-less metal layer is used as a growth layer for electro-chemical growth of metal.

In accordance with a twentieth embodiment of the method, the patterning means is a stamp.

In accordance with the invention, as defined in a twenty-first embodiment, there is further provided a method for manufacturing an organic light emitting device (OLED), which utilizes the fourth embodiment of the method for providing a substrate with a patterned layer, and further comprises:

depositing organic layers onto the patterned layer to form an organic light emitting device.

Hence, using the patterned substrate as an anode with integrated current spreading grids, embodied by the second layer, and a mash, embodied by the third layer, an OLED is provided by depositing organic layers and a conducting layer (the cathode) directly on top of the patterned substrate which is advantageous since the OLED is produced in a similar manner as the patterned sol-gel metallization layer and on the same flow line, i.e. by, at least partly, utilizing soft lithographic techniques. The cathode is advantageously created using at least selected steps of the method according to the present invention.

In accordance with a twenty-second embodiment of the method of manufacturing an OLED, the method utilizes the third embodiment of the method for providing a substrate with a patterned layer and further comprises:

depositing organic layers onto the patterned layer to form an organic light emitting device, and wherein the organic layers comprise a hole injection material. Here the third conducting layer is left out since the hole injection material in combination with a conducting grid pattern will act as shunting of the OLED and hence provide a sufficient conductance of the anode. This is advantageous since by leaving out the third conducting layer a higher light efficiency of the OLED is achieved. Furthermore the production costs are decreased when reducing the amount of process steps.

In accordance with a twenty-third embodiment of the method of manufacturing an OLED, the organic layers are arranged with a conducting layer. In this embodiment the cathode is preferably formed on the opposite side of the OLED with respect to the anode.

In accordance with the invention, as defined in a twenty-fourth embodiment, there is further provided a method of manufacturing an organic photovoltaic device, which utilizes the fourth embodiment of the method for providing a substrate with a patterned layer and further comprises:

depositing organic layers (30) onto said patterned layer to form an organic photovoltaic device.

Hence, using the patterned substrate as an anode with integrated current spreading grids, embodied by the second layer, and a mash, embodied by the third layer, a photovoltaic device, i.e. an organic solar cell, is provided by depositing organic layers and a conducting layer (the cathode) directly on top of the patterned substrate which is advantageous since the photovoltaic device is produced in a similar manner as the patterned sol-gel metallization layer and on the same flow line, i.e. by, at least partly, utilizing soft lithographic techniques. The cathode is advantageously created using at least selected steps of the method according to the present invention.

In accordance with a twenty-fifth embodiment, a method of manufacturing an organic solar cell includes forming a patterned layer on a substrate by means of the method according to the third embodiment, and depositing organic layers onto the patterned layer to form an organic photovoltaic device, wherein the organic layers comprise a hole injection material. Here the third conducting layer is left out since the hole injection material in combination with a conducting grid pattern will act as shunting of the photovoltaic device and hence provide a sufficient conductance of the anode. This is advantageous since by leaving out the third conducting layer a higher light efficiency of the photovoltaic device is achieved. Furthermore the production costs are decreased when reducing the amount of process steps.

In accordance with a twenty-sixth embodiment, in a method of manufacturing a photovoltaic device, the organic layers are arranged with a conducting layer. In this embodiment the cathode is preferably formed on the opposite side of the photovoltaic device with respect to the anode.

The invention is based on an insight that by providing a layer in which a pattern is imprinted, and selectively making the surface of the patterned layer homophobic and the pattern homophilic, a favorable manner of filling the pattern with a second material containing polar molecules is accomplished as the homophilic and homophobic subareas of the surface are arranged as to favor the distribution of the filling material into the pattern, and by using this an improved method for providing shunting of an OLED is advantageously achieved.

These and other aspects, features, and advantages of the invention will be apparent from and elucidated with reference to the embodiments described hereinafter.

BRIEF DESCRIPTION OF THE DRAWINGS

The invention will now be described in more detail and with reference to the appended drawings, in which.

Figure 3:
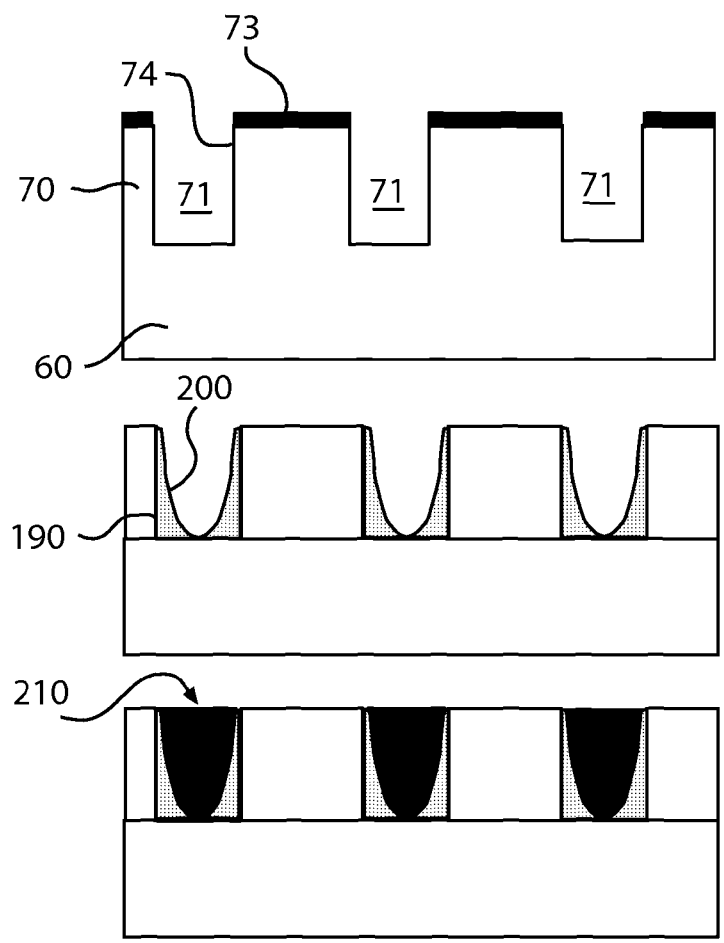
Figure 4:
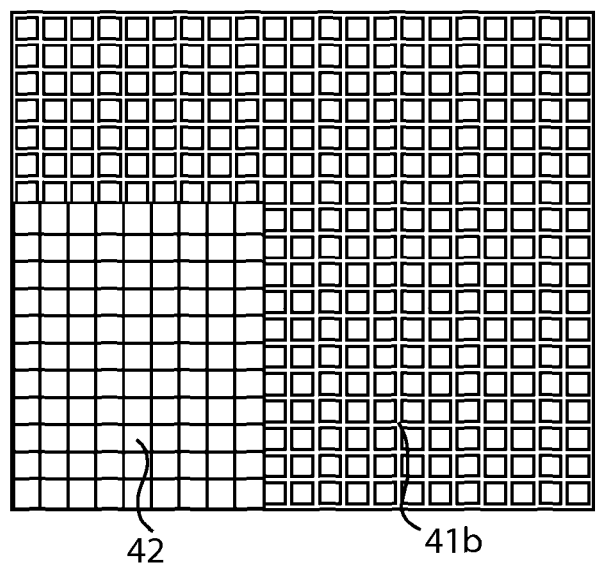

b) illustrates a schematic front view of an OLED having a patterned conductive layer of extra metallization;

c) illustrates a schematic front view of an OLED having a patterned conductive layer of extra metallization;

FIG. 2 is a schematic illustration of the main steps of the method according to an embodiment of the present invention;

FIG. 3 is a schematic illustration of alternative steps of the method according to an embodiment of the present invention;

FIG. 4 is a schematic illustration of a mash and grid pattern comprising of fine structures and coarse gridded pattern for creating thin patterns and wider lines.

DESCRIPTION OF PREFERRED EMBODIMENTS

For the purpose of clarifying the method according to the present invention exemplary embodiments of the present invention will now be described.

Figure 1A:
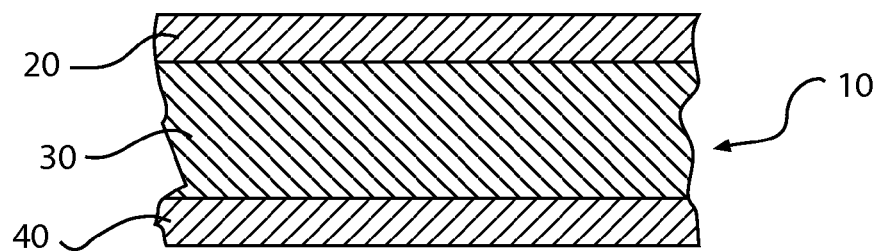
FIG. 1a) illustrates a schematic cross-sectional view of an organic light emitting device like an OLED or a photovoltaic device.

A basic aspect of the method is the manufacture of a certain layer of an electronic device, such as an OLED or an organic photovoltaic device (i.e. an organic solar cell), see FIG. 1a). The layer is a conducting layer, for instance the cathode layer 20 or the anode layer 40 of the OLED 10, which in other respects also contain several organic layers 30 between the anode and cathode layers 20, 40. The conducting layer can be regarded as an extra metallization, as has been described above in the background of the invention. The extra metallization is added to realise a current distribution layer that has a low resistivity and high open area. In practice this results in high aspect ration metal lines on the OLED 10.

Figure 1B:
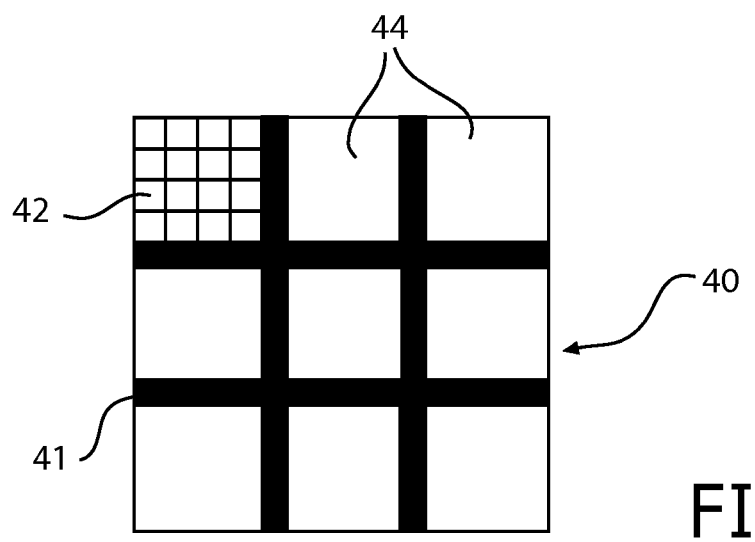
Figure 1C:
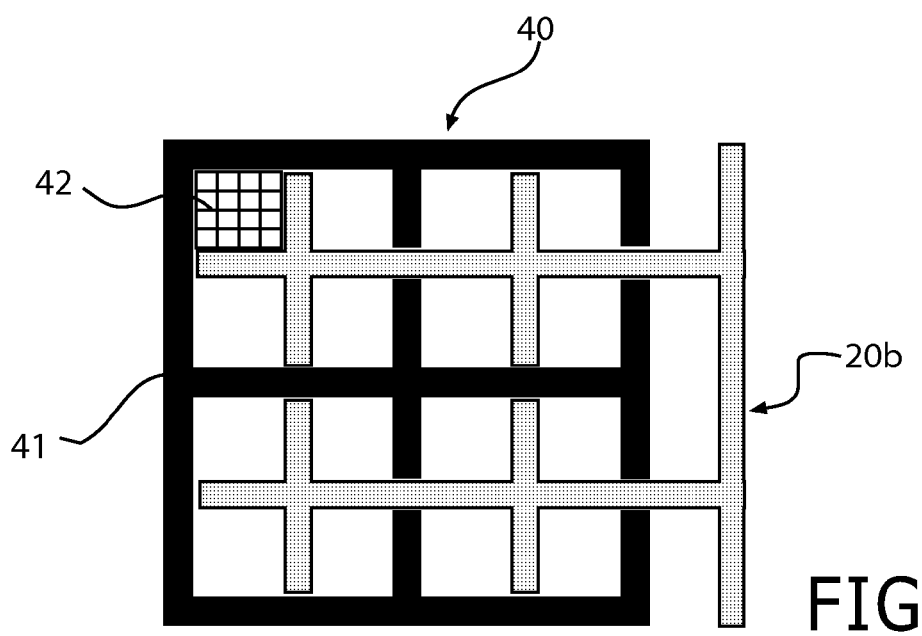

In the following the method according to the present invention is described in an non-limiting illustrative example in which an OLED is provided with extra metallization. Let us consider making an extra metallization, in the form of a grid 41 and a mash 42 as illustrated in FIG. 1b), on an anode layer 40 for the purpose of shunting an OLED 10. Referring now to FIG. 2, as a first step a first patterning means 50 with a desired pattern, i.e a grid 41, as illustrated in FIG. 1 in this example, is provided. The patterning means 50 is a PDMS (Polydimethylsiloxane) stamp with a relief structure 51 corresponding to the desired pattern, i.e. the grid 41 and mash 42. The stamp is produced by cast molding according to known manners within the area of soft lithography. In short, the stamp 50 is manufactured by pouring a resin including PDMS in a mold and letting the resin cure. The mold is preferably manufactured with photolithography and etching of a desired pattern into a silicon substrate, or according to some other known nano- or microscale lithography process. By using the above process, the relief patterns acquired in the stamp, i.e. the pattern for the grid 41 and the mash 42, can be achieved having aspect ratios of up to 10 and lateral dimension for the grid 41 from below a micron to hundreds of microns. The process is not restricted to PDMS. Other examples of suitable material for the patterning means 50 are elastomers such as polyimides and polyurethanes, and fluorosilicone.

When designing the pattern to be provided to the patterning means for forming a pattern layer on a substrate according to the present method, a pattern that constitutes of both a finer structure, the mash 42, and wider lines, the grid 41, are achieved on the same stamp 50. This makes it possible to utilize the same stamp and patterning method for imprinting a pattern of fine structures and wider lines simultaneously, in a one step process. More specifically the wide lines 41b are created by dividing the line into a coarse gridded pattern as is depicted in FIG. 4. The dimensions of the coarse gridded pattern is preferably adapted to suit the used material and steps of filling of the patterned layer which is described further below.

Thus, an advantageous way of forming wide lines and a fine mesh can be obtained in a one step process, which once the patterning means have been provided is repeatable by using the patterning means onto new substrates. Fine lines of very small structural features with pitches down to nano-scale can be combined with wider lines. For practical reasons there is a constraint on the size of the largest lateral features that may be produced by means of the current technique and this is solved by building up larger features form smaller sized patterns, i. e. by letting wider lines be constituted by a coarse gridded pattern. This eliminates problems with material surplus during the filling of the patterns, which problems otherwise would occur when trying to produce too wide lines by means of the present method.

Next, a first layer 70 is provided on a transparent substrate 60, made of glass or plastic. The first layer is preferably constituted by a transparent sol-gel material, a polymer or any other material which is suitable for imprinting patterns. As an illustrative non-limiting example a sol-gel material is used to form the first layer in the following description. It should be clear though, that the method is also applicable to a polymer layer, which may be formed by using for instance polyimide.

The first layer 70, which hereinafter is referred to as the sol-gel layer 70, is preferably applied onto the substrate 60 by spin coating, i.e. a sol-gel material coating fluid is dispensed upon the clean substrate 60 which is then placed on a spinner. Depending on the sol-gel material used, the spinning process is optimized to result in required thickness and uniformity of the sol-gel layer 70 (which is determined by the spinner speed, temperature, the sol-gel viscosity and solvent evaporation etc.). In alternative embodiments the coating fluid is dispensed upon the substrate 60 by dip coating, spraying, electrophoresis, inkjet printing or roll coating.

Figure 2A:
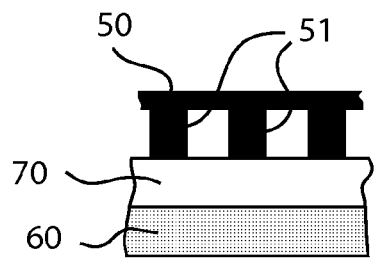
Figure 2B:
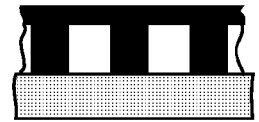
Figure 2C:
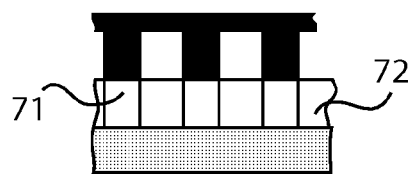

After the sol-gel layer 70 has been provided to the substrate 60, a pattern of recesses is provided by imprinting the stamp 50 into the sol-gel layer 70, FIG. 2b), such that the relief pattern 51 of the stamp 50 is pressed into the sol-gel layer 70. Preferably the sol-gel layer 70 is partly reacted as to achieve an appropriate viscosity. As the stamp 50 is imprinted, sol-gel has reacted to form as solid and as the stamp is retracted from the sol-gel layer 70, recesses 71 are formed in the sol gel layer 70, FIG. 2c), leaving areas of the sol-gel layer, that have not been recessed 72.

Next, the sol-gel layer 70 is cured in an oven at a temperature of typically 200 to 400° C. for 20 minutes. The curing temperature and time is material dependent and the temperatures that are provided here are non-limiting examples and should not be regarded as being limiting to the scope of the invention.

Figure 2D:
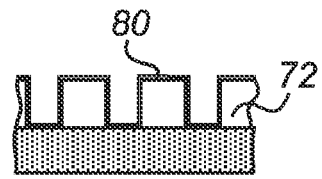
Figure 2E:
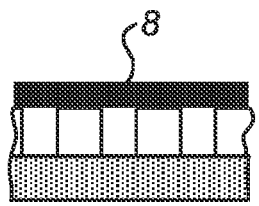
Figure 2F:
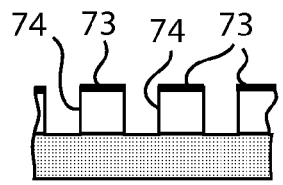

In an alternative embodiment, a step of providing a barrier layer 80, see FIG. 2d, is performed following the step of curing the sol-gel layer 70. The barrier layer 80, which is realized with a thin film encapsulation, TFE, may be a high temperature plasma enhanced chemical vapour deposition (PECVD) Silicon-nitride/Silicon-oxide/Silicon-nitride/Silicon-oxide/Silicon-nitride and acts as a water barrier. Other inorganic materials (e.g. $AlO_x$, polyacrylate-Ag-polyacrylate-Ag-polyacrylate-Ag-polyacrylate (PAPAPAP)) and techniques like atomic layer deposition (ALD) may be used to provide the barrier layer. The water barrier prevents water from diffusing into the device. The barrier layer 80 is suitable for both sol-gel layers or/and polymer layers.

After the curing of the sol-gel layer 70, the sol-gel layer is subjected to a first surface treatment. The surface of the sol-gel layer 70 is made hydrophilic by means of a UV-ozone treatment. In an alternative embodiment the surface of the sol-gel layer 70 is made hydrophilic by means of oxygen plasma. Another alternative embodiment is using methods for wet chemical oxidation, e.g. pirahna etch.

The sol-gel layer 70 is then subjected to a second surface treatment, wherein a selected subarea of the surface of the sol-gel layer 70 is made hydrophilic, so that the surface of the cured sol-gel layer 70 is covered by a subarea that is hydrophilic and a subarea that is hydrophobic. In this embodiment, the second surface treatment is done by applying a second patterning means, a flat PDMS stamp 8, which contains a reactive hydrophobic precursor, like MTMS or a fluorosilane. Consequently top surfaces 73, i.e. a subarea including surface portions between the recesses 71 and excluding the recesses 71, see FIGS. 2e) and f) are subjected to the reactive hydrophobic precursor, resulting in the surface of the patterned sol-gel layer 70 having a hydrophobic subarea 73 and a hydrophilic subarea 74, which hydrophilic subarea 74 is constituted by the surfaces of the recesses 71.

Figure 2G:
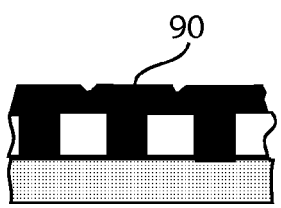

Next a conducting pattern material is deposited onto the substrate by filling the recesses 71 by making use of self assembly with a second layer 90, see FIG. 2g) constituted by a conducting patterning material. The conducting patterning material is a metal containing liquid which is applied by spin coating onto the sol-gel layer 70. The metal containing liquid is chosen as to contain polar molecules, i.e. the liquid is polar. Some examples of polar liquids are water, methanol, and N-methylpyrrolidone. In alternative embodiments the second layer 90 is provided by means of spray coating, ink jetting or a doctors blade distribution. In this embodiment the metal containing liquid is composed of nano-particles of silver and a stabilising medium. The nano-particles enhance sintering at low temperatures and so form good conducting metals (temperatures range from 100 to 400° C.). Other suitable metals for filling the recesses 71 is one of gold, nickel and copper.

Figure 2H:
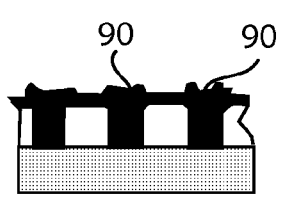

As the silver containing liquid 90 is allowed to dry, instabilities form over the hydrophobic subarea 73 due to the polar molecules in the liquid and the second layer 90 redistributes from the hydrophobic subarea 73 into the recesses 71, i.e. breaks up and concentrates in the hydrophilic recesses 71, FIGS. 2h) and i). After drying, a small recess in the top surface of the second layer 90 may be formed as illustrated in FIG.

2i), whereby the steps of providing the second layer 90 may have to be repeated to flatten the top surface of the second layer 90. At this point a silver grid 90 has been created in the transparent sol-gel layer 70.

It should be mentioned that this method of imprinting patterns into a layer, which may be constituted by a sol-gel material, with an elastomeric stamp is also suitable for providing patterns of other non-conductive materials into the layer.

In an alternative embodiment the metal is provided to the sol-gel layer by damascening of metal in glass.

Figure 2I:
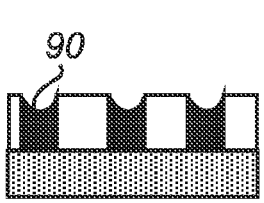
Figure 2J:
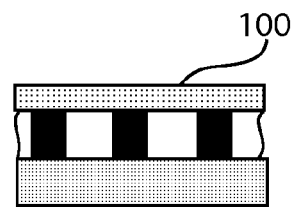

Finally a shadow mask, which is patterned to cover the grid and provide the pattern of the mash, is used to cover the grid while the subtiles 44 between the grids are provided with a third layer 100, FIG. 2j). This is done by spray pyrolisis of tin/zinc solutions, giving a mash 42 which is constituted by a planar transparent tin-/zinc oxide. In an alternative embodiment the mash 42, 100 is produced by having ITO deposited onto the subtiles 44 by means of a sputtering process.

In the embodiment of the method according to the present invention as described above, an anode 40 to an OLED was created. If desirable the pattern created may be designed to create an anode 40 and a cathode 20b onto the same substrate, see FIG. 1c) or any other desirable pattern.

Referring now to FIG. 3, an embodiment of the method according to the present invention is described which comprises an alternative way of depositing the conducting pattern material into the recesses 71 formed in the sol-gel layer 70. The surfaces of the sol-gel layer 70 are made hydrophilic and hydrophobic in the same fashion as has already been described above resulting in a layer 70 with a hydrophobic top surface 73 having recesses 71 with hydrophilic surface areas 74, see FIG. 3a). The recesses 71 are then filled with a metal precursor, i.e. salt, or metal nano particles by means of ink jetting or spin coating the precursor over the patterned sol-gel layer 70. The solution with the metal precursor has a high surface tension and is preferably based on water, i.e comprises polar molecules. Thin liquid films will spontaneously break up on a surface with a low surface energy. None of the precursor material solution is, due the hydrophobic nature of the subareas constituted by the surfaces 73 of the sol-gel layer 70, left on the surface 73 but substantially all of it is deposited in the recesses 71, leaving a thin film 190 on the hydrophilic surfaces 74. The substrate is then placed in an oven to heat the thin film 190. The heating of the film 190 speeds up the drying process, and/or activates the metal. In an alternative embodiment this step is left out.

The precursors in the thin film 190 is converted into nucleation sites suitable for deposition of electro-less metal. The metal is preferably silver, but in alternative embodiments the metal is copper, gold, palladium, platinum or nickel. For the purpose of creating the nucleation sites a number of precursor materials are known in the art. Suitable precursor are for instance silver salts, palladiums salts, silver nano particles, palladium nano particles and tin salts.

Electro-less plating is a known commonly used method for depositing a metal coating onto surfaces. To coat the surface 74 by electro-less plating, the substrate 60 is placed in a metal compound solution and the elemental metal is subsequently then deposited via a chemical reaction. The electro-less plating provides a highly uniform metal coating 200 on the surface 74.

The metal coating 200 is arranged to serve as an conductive base for filling the recesses 71 with metal by means of electrochemical growth of e.g. copper. Electrochemical growth of metals is well known in the art, and will not be further described here.

A grid of copper pattern 210 is produced by the electrochemical growth of copper which ensures a low resistivity of the anode. Using electrochemical growth of metal to fill the bulk of the recesses 71 is a cheap and self patterning way to deposit the metal. Other suitable metals to form the grid 41, 210 by electrochemical growth are known by the skilled person and are to be considered as falling within the scope of the invention as claimed.

The thin metal coating 200 of the recesses 71 is, besides from constituting a conductive base for electrochemical growth of a metal, arranged to advantageously act as a mirror, when used in an lighting devices like for instance an OLED. The metallized surfaces 74 of the recesses 71 will act as a plurality of highly reflecting surfaces, which will increase light out coupling of light from the substrate 60 and the transparent first layer 70. The plurality of reflecting surfaces, which are patterned at a very small scale as described above, is due to the small scale formed to act as a light scattering layer, i.e. a layer that alters the incident angle of light falling into it and that are to be output from the OLED. By scattering light, which have an incident angle larger than the angle of total reflection for the substrate 60 surface (and for the sol-gel layer 70 surface) and altering the angle so that the next time the light reaches the substrate surface 60 it is possible for the light to escape from total reflection within the substrate 60. Hence a higher light out coupling from the substrate is obtained.

The scattering layer can also be achieved by roughening of the substrate surface. However, this leaves an opaque surface. By utilising the mirror effect of the thin metal coating 200 of the present invention, as described above, a smooth transparent surface having a high light out coupling efficiency is accomplished.

A substrate provided with a patterned layer as described in the method above, is suitable for use as extra metallization, i.e. shunting in an OLED or an organic photovoltaic device.

An embodiment of an aspect of the method for manufacturing an organic light emitting device, OLED, comprises first forming an anode 40 according to the method of the present invention as described in different embodiments above. Furthermore, organic layers 30 are deposited upon the patterned and metallized layer 70 of the anode, to form an organic light emitting device according to known manners in prior art. A conductive layer 20, the cathode 20, is then finally deposited onto of the organic layers 30. The cathode 20 is preferably a metal electrode made of Ca, Ba, Mg, LiF, Al, etc.

In an alternative embodiment the conductive layer 20 is obtained by the method according to the present invention.

In an embodiment of the method according to the present invention, the final step of providing the anode 40 with a planar thin conducting layer 100, FIG. 2i), is left out. The advantage of not using this thin conducting layer is higher out coupling for the light, which will increase the efficiency of the device and also reduce the production costs. When using this type of anode as shunting of an OLED the metal grid 41 is combined with a hole injection material, e.g. PEDOT (polyethylenedioxythiophene), deposited on top of the patterned sol-gel layer 70, which will serve to provide sufficient conductance.

An embodiment of an aspect of the method for manufacturing an organic photovoltaic device comprises first forming an anode 40 according to the method of the present invention as described in different embodiments above. Furthermore, the organic layers 30 are deposited upon the patterned and metallized layer 70 of the anode, to form an organic photovoltaic device according to known manners in prior art.

The organics used in the photovoltaic device are basically the same as when manufacturing an OLED. However, in the photovoltaic device the light emitting material is replaced by an organic photovoltaic material. e.g. a PCBM/MDMO blend.

A conductive layer 20, the cathode 20, is then finally deposited onto the organic layers 30. The cathode 20 is preferably a metal electrode made of Ca, Ba, Mg, LiF, Al, etc.

In an alternative embodiment the conductive layer 20 is obtained by the method according to the present invention.

In an embodiment of the method according to the present invention, the final step of providing the anode 40 with a planar thin conducting layer 100, FIG. 2i), is left out. The advantage of not using this thin conducting layer is higher coupling for light entering the device, which will increase the efficiency of the device and also reduce the production costs. When using this type of anode as shunting of an organic photovoltaic device the metal grid 41 is combined with a hole injection material, e.g. PEDOT (polyethylenedioxythiophene), deposited on top of the patterned sol-gel layer 70, which will serve to provide sufficient conductance.

Some examples of making grids are discussed below and presented in Tables 2 and 3. Consider an area of 100×100 μm and an area of 50×50 μm which both contains a number of grids of 10 μm height that cover a total area of 1% and 10% respectively. An efficient OLED has an light output of 25 lm/W achieved at a current $I_0$=25.6 A per m$^2$.

As it can be observed from Table 2 in comparison with Table 1, the acceptable sheet resistance of 0.01Ω per square for large area applications can be achieved. By increasing the number of grids the voltage drop across the device is the same but the uniformity of the light distribution becomes better.

From Table 3 it can be observed that it is possible to achieve a low voltage drop across the device without using a third conductive layer, i.e. the ITO-layer in the described embodiments above.

TABLE 2

Grid resistance and voltage drop across one grid cell and across an OLED with light output efficiency of 25 lm/W

| Grid area [μm] | Cover area [%] | Grid sheet resistance [Ω per square] | Voltage drop [mV] (for grid cell) | Max voltage drop [V] (for 1 m$^2$) |
|---|---|---|---|---|
| 100 × 100 | 1 | 0.17 | 0.4352 | 1.088 |
| | 10 | 0.017 | 0.04352 | 0.1088 |
| 50 × 50 | 1 | 0.17 | 0.2176 | 1.088 |
| | 10 | 0.017 | 0.02176 | 0.1088 |

TABLE 3

Voltage drop across one grid cell covered by PEDOT

| | Efficiency 25 lm/W | | Efficiency 100 lm/W | |
|---|---|---|---|---|
| Area [μm] | Voltage drop over 500 Ω per square PEDOT [V] | Voltage drop over 150 Ω per square PEDOT [V] | Voltage drop over 500 Ω per square PEDOT [V] | Voltage drop over 150 Ω per square PEDOT [V] |
| 100 × 100 | 0.64 | 0.19 | 0.16 | 0.0475 |
| 50 × 50 | 0.16 | 0.0475 | 0.04 | 0.0119 |

Above, embodiments of the method for forming a patterned layer on a substrate by means of a sol-gel imprinting process according to the present invention as defined in the appended claims have been described. These should be seen as merely non-limiting examples. As understood by a skilled person, many modifications and alternative embodiments are possible within the scope of the invention.

It is to be noted, that for the purposes of this application, and in particular with regard to the appended claims, the word "comprising" does not exclude other elements or steps, that the word "a" or "an", does not exclude a plurality, which per se will be apparent to a person skilled in the art.

The invention claimed is:

1. A method for forming a patterned layer on a substrate by means of an imprint process comprising the steps of:
providing a single patterning means;
providing a first layer on a surface of said substrate;
simultaneously forming patterns of recesses in the first layer by imprinting said first layer with said patterning means, wherein said patterns of recesses includes a first pattern of recesses and a second pattern of recesses that are wider than said recesses of said first pattern;
curing said first layer;
performing a first surface treatment onto said first layer to make a surface of the first layer hydrophilic;
performing a second surface treatment onto a selected subarea of the surface of said first layer to make said subarea hydrophobic, said subarea including surface portions between said recesses of said first pattern and excluding said recesses of said first pattern; and
depositing a first conducting pattern material into said recesses of said first pattern and a second conducting pattern material that is different from said first conducting pattern material into said recesses of said second pattern, wherein the first and second conducting pattern materials form a single, cohesive electrode and wherein the chemical composition of said electrode in said recesses of said first pattern is different from the chemical composition of said electrode in said recesses of said second pattern.

2. The method according to claim 1, further comprising the step of, after curing said first layer:
providing a barrier layer.

3. The method according to claim 1, wherein the step of depositing said first conducting pattern material into said recesses of said first pattern further comprises performing at least one time the steps of:
depositing a second layer onto said first layer, wherein said second layer contains polar molecules;
allowing said second layer to dry, wherein said second layer is redistributed from said hydrophobic subarea into said recesses of said first pattern.

4. A method according to claim 3, wherein the step of depositing said second conducting pattern material into said recesses of said second pattern further comprising the steps of:
masking said first and second layers providing unmasked areas;
depositing a third layer onto said unmasked areas.

5. The method according to claim 4, wherein said third layer is conducting.

6. The method according to claim 4, wherein said step of depositing a third layer is done by sputtering.

7. The method according to claim 3, wherein said step of depositing a second layer is done by means of one of spin coating, spray coating, ink jetting, or a doctors blade distribution.

8. The method according to claim 3, wherein said second layer comprises a metal-containing liquid.

9. The method according to claim 8, wherein said metal containing liquid contains one of a metal precursor and metal nano particles.

10. The method according to claim 9, further comprising the steps of, after drying said metal containing liquid:
   applying a treatment, wherein said precursors are converted to nucleation sites for deposition of electro-less metal; and
   depositing a thin electro-less metal layer on said nucleation sites.

11. The method according to claim 1, wherein the first layer is a sol-gel material and wherein the method further comprises the step of:
   at least partly reacting said sol-gel material before the imprinting.

12. The method according to claim 1, wherein the first layer comprises a polymer material.

13. The method according to claim 1, wherein said first surface treatment is one of a UV-ozone treatment, a plasma treatment and a wet chemical oxidation.

14. The method according to claim 1, wherein said second surface treatment is done by means of applying a reactive hydrophobic precursor.

15. The method according to claim 1, wherein the second conducting pattern material is transparent.

16. The method according to claim 15, wherein the first conducting pattern material is composed of an elemental metal and wherein the recesses of said second pattern are disposed between recesses of said first pattern and provide a shunting function for said electrode.

17. A method for forming a patterned layer on a substrate by means of an imprint process comprising the steps of:
   providing a single patterning means;
   providing a first layer on a surface of said substrate;
   simultaneously forming patterns of recesses in the first layer by imprinting said first layer with said patterning means, wherein said patterns of recesses includes a first pattern of recesses and a second pattern of recesses that are wider than said recesses of said first pattern;
   curing said first layer;
   performing a first surface treatment onto said first layer to make a surface of the first layer hydrophilic;
   performing a second surface treatment onto a selected subarea of the surface of said first layer to make said subarea hydrophobic, said subarea including surface portions between said recesses of said first pattern and excluding said recesses of said first pattern; and
   depositing a first conducting pattern material into said recesses of said first pattern and a second conducting pattern material that is different from said first conducting pattern material into said recesses of said second pattern, wherein the first and second conducting pattern materials form a single, cohesive electrode,
   wherein the step of depositing said first conducting pattern material into said recesses of said first pattern further comprises performing at least one time the steps of:
      depositing a second layer onto said first layer, wherein said second layer contains polar molecules, and
      allowing said second layer to dry, wherein said second layer is redistributed from said hydrophobic subarea into said recesses of said first pattern, and
   wherein the step of depositing said second conducting pattern material into said recesses of said second pattern further comprises the steps of:
      masking said first and second layers providing unmasked areas,
      depositing a third layer onto said unmasked areas by means of spray pyrolysis of tin/zinc solutions.

18. A method for forming a patterned layer on a substrate by means of an imprint process comprising the steps of:
   providing a single patterning means;
   providing a first layer on a surface of said substrate;
   simultaneously forming patterns of recesses in the first layer by imprinting said first layer with said patterning means, wherein said patterns of recesses includes a first pattern of recesses and a second pattern of recesses that are wider than said recesses of said first pattern;
   curing said first layer;
   performing a first surface treatment onto said first layer to make a surface of the first layer hydrophilic;
   performing a second surface treatment onto a selected subarea of the surface of said first layer to make said subarea hydrophobic, said subarea including surface portions between said recesses of said first pattern and excluding said recesses of said first pattern; and
   depositing a first conducting pattern material into said recesses of said first pattern and a second conducting pattern material that is different from said first conducting pattern material into said recesses of said second pattern, wherein the first and second conducting pattern materials form a single, cohesive electrode and wherein the second conducting pattern material is transparent.

19. The method according to claim 18, wherein the first conducting pattern material is composed of an elemental metal.

20. The method according to claim 19, wherein the recesses of said second pattern are disposed between recesses of said first pattern and provide a shunting function for said electrode.

* * * * *